(12) United States Patent
Lee et al.

(10) Patent No.: US 11,674,721 B2
(45) Date of Patent: Jun. 13, 2023

(54) REFRIGERATOR

(71) Applicant: LG ELECTRONICS INC., Seoul (KR)

(72) Inventors: Kiwook Lee, Seoul (KR); Namsoo Lee, Seoul (KR); Chanmyung Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 119 days.

(21) Appl. No.: 17/253,213

(22) PCT Filed: Jul. 10, 2019

(86) PCT No.: PCT/KR2019/008509
§ 371 (c)(1),
(2) Date: Dec. 17, 2020

(87) PCT Pub. No.: WO2020/013613
PCT Pub. Date: Jan. 16, 2020

(65) Prior Publication Data
US 2021/0116155 A1 Apr. 22, 2021

(30) Foreign Application Priority Data

Jul. 13, 2018 (KR) .................... 10-2018-0081885

(51) Int. Cl.
*F25B 31/00* (2006.01)
*F28F 3/12* (2006.01)

(52) U.S. Cl.
CPC .............. *F25B 31/006* (2013.01); *F28F 3/12* (2013.01)

(58) Field of Classification Search
CPC ...... F25B 31/006; F25B 49/02; F25B 49/022; F25B 2600/021; F28F 3/12; Y02B 30/70; H01L 21/67; H01L 21/67098

(Continued)

(56) References Cited

U.S. PATENT DOCUMENTS 7,781,258 B2* 8/2010 Toba ..................... H01L 25/072
438/107
9,681,580 B2* 6/2017 Loong ................ H05K 7/20254
(Continued)

FOREIGN PATENT DOCUMENTS

JP 2007-012722 1/2007
JP 2011-177004 9/2011
(Continued)

OTHER PUBLICATIONS

Machine Translation KR 2008008333A (Year: 2008).*
(Continued)

*Primary Examiner* — Len Tran
*Assistant Examiner* — Gustavo A Hincapie Serna
(74) *Attorney, Agent, or Firm* — Ked & Associates, LLP

(57) ABSTRACT

A refrigerator according to an embodiment of the present invention includes: a compressor configured to compress a refrigerant; and an inverter module configured to control the compressor, wherein the inverter module includes: a heatsink provided with a cooling passage through which coolant passes; a coolant inlet connected to the heatsink to communicate with an inlet of the cooling passage; a coolant outlet connected to the heatsink to communicate with an outlet of the cooling passage; at least one insulated gate bipolar transistor (IGBT) disposed on a top surface of the heatsink; and at least one diode disposed to be spaced apart from the IGBT on the top surface of the heatsink, wherein the cooling passage includes: an IGBT cooling passage that is closer to the coolant inlet among the coolant inlet and the coolant outlet; and a diode cooling passage that is closer to the coolant outlet among the coolant inlet and the coolant outlet, wherein the diode cooling passage is disposed behind the IGBT cooling passage in a flow direction of the coolant.

6 Claims, 6 Drawing Sheets

(58) Field of Classification Search
USPC ........................................................ 62/259.2
See application file for complete search history.

(56) References Cited

U.S. PATENT DOCUMENTS

| | | | | |
|---|---|---|---|---|
| 9,723,764 | B2* | 8/2017 | Sugita | H05K 7/20927 |
| 9,999,150 | B2* | 6/2018 | Maeda | H02M 7/003 |
| 11,284,534 | B2* | 3/2022 | Yamaguchi | H01L 23/473 |
| 2008/0130223 | A1* | 6/2008 | Nakamura | H02M 7/003 |
| | | | | 361/689 |
| 2008/0218970 | A1* | 9/2008 | Kehret | H05K 7/20254 |
| | | | | 361/699 |
| 2009/0260382 | A1* | 10/2009 | Takeichi | F24F 1/54 |
| | | | | 361/752 |
| 2010/0226104 | A1* | 9/2010 | Takeichi | F24F 1/54 |
| | | | | 361/752 |
| 2011/0188204 | A1* | 8/2011 | Horiuchi | H05K 7/20927 |
| | | | | 29/527.1 |
| 2012/0139096 | A1* | 6/2012 | Gohara | H01L 23/3735 |
| | | | | 257/E23.101 |
| 2012/0170217 | A1* | 7/2012 | Nishikimi | H02M 7/003 |
| | | | | 361/689 |
| 2015/0077939 | A1* | 3/2015 | Lee | H05K 7/2039 |
| | | | | 361/700 |
| 2015/0116938 | A1* | 4/2015 | Nakanishi | B23P 15/26 |
| | | | | 165/104.11 |
| 2015/0223366 | A1* | 8/2015 | Horiuchi | H05K 7/20254 |
| | | | | 361/689 |
| 2015/0234438 | A1* | 8/2015 | Druzhinin | G06F 1/20 |
| | | | | 361/679.53 |
| 2017/0303445 | A1* | 10/2017 | Robert | H05K 7/20872 |
| 2018/0352685 | A1* | 12/2018 | Wan | H05K 7/20909 |
| 2019/0003786 | A1* | 1/2019 | Birkett | F28F 3/12 |
| 2019/0376733 | A1* | 12/2019 | Pirmez | F25B 13/00 |

FOREIGN PATENT DOCUMENTS

| | | | | |
|---|---|---|---|---|
| JP | 2014-017933 | | 1/2014 | |
| KR | 10-2008-0083330 | | 9/2008 | |
| KR | 20080083330 A | * | 9/2008 | ............. H02M 7/48 |
| KR | 10-2010-0132063 | | 12/2010 | |
| KR | 20100132063 A | * | 12/2010 | ............. H01L 23/34 |
| WO | WO-2015092515 A1 | * | 6/2015 | ........... H05K 5/0008 |

OTHER PUBLICATIONS

Machine Translation KR 20100132063A (Year: 2010).*
International Search Report dated Oct. 16, 2019 issued in Application No. PCT/KR2019/008509.

* cited by examiner

[FIG. 1]
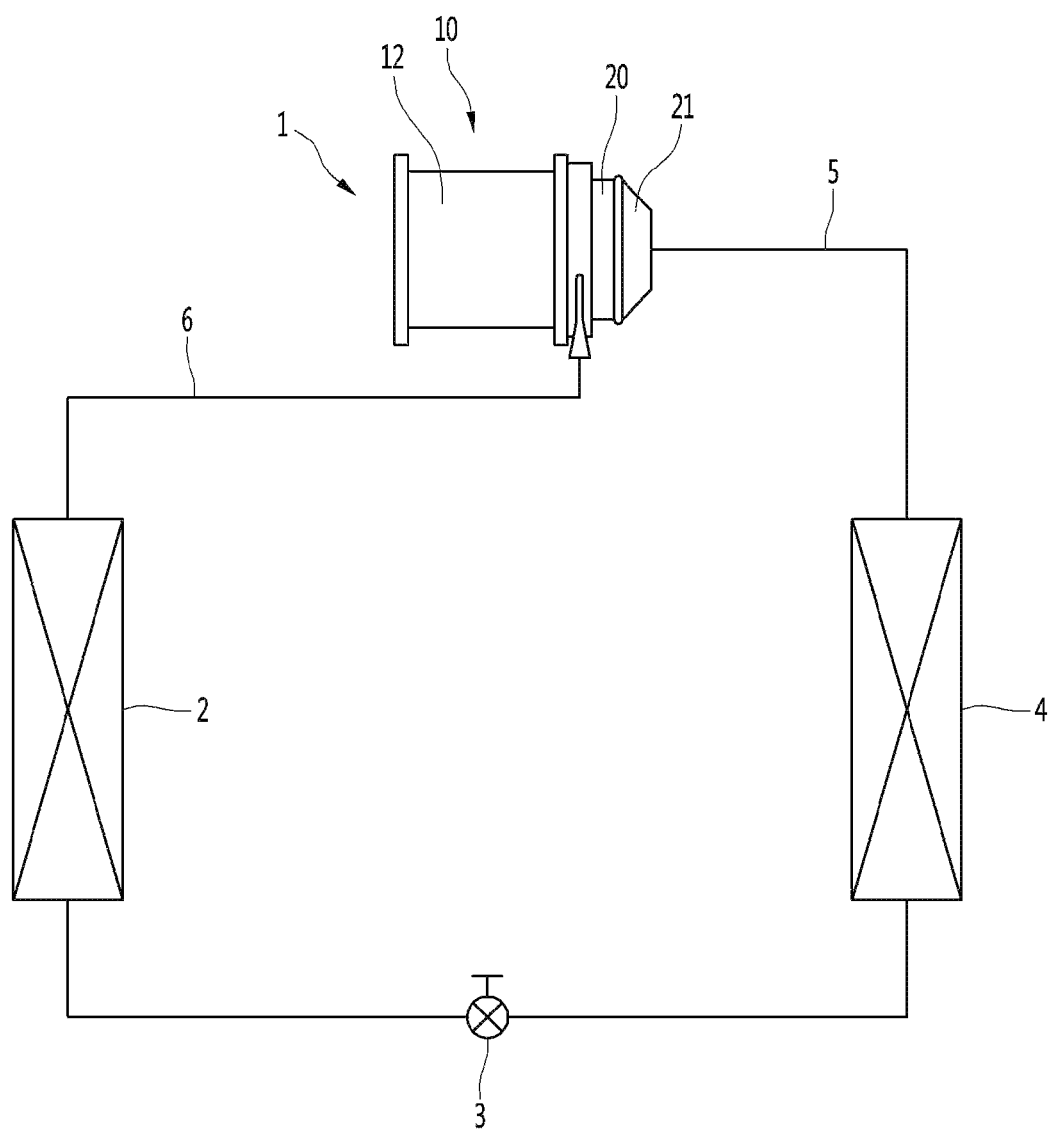

[FIG. 2]
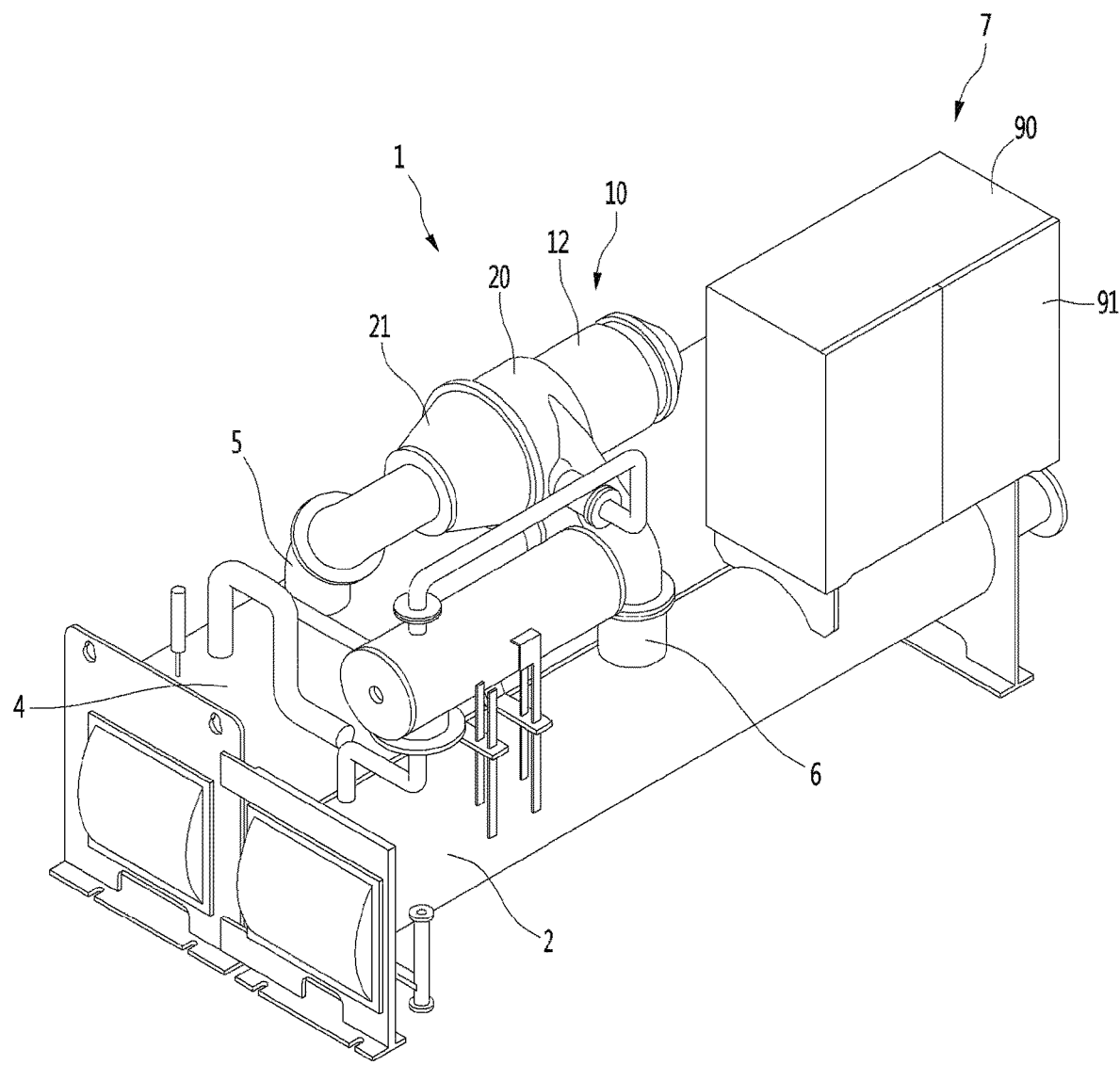

[FIG. 3]
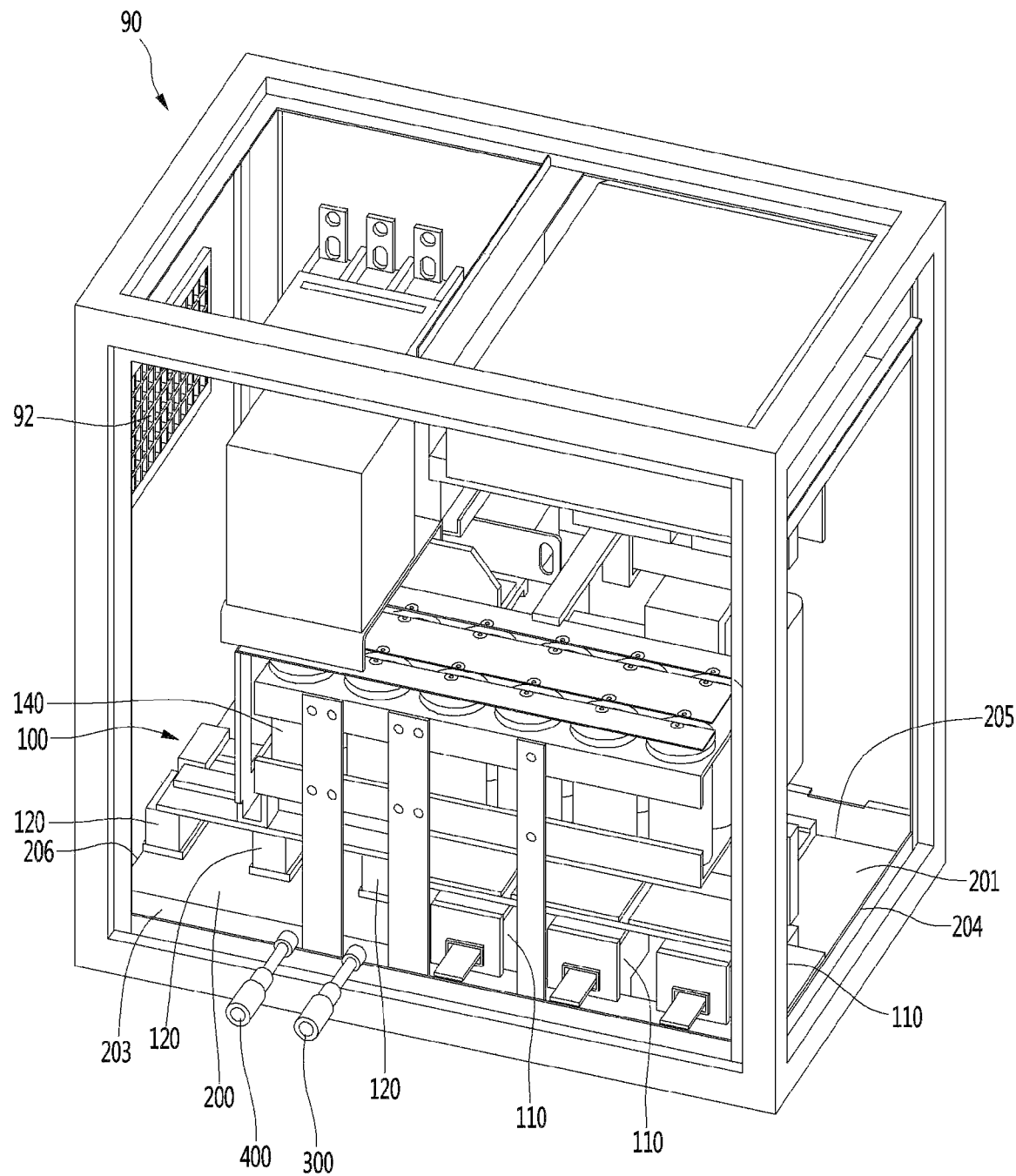

[FIG. 4]
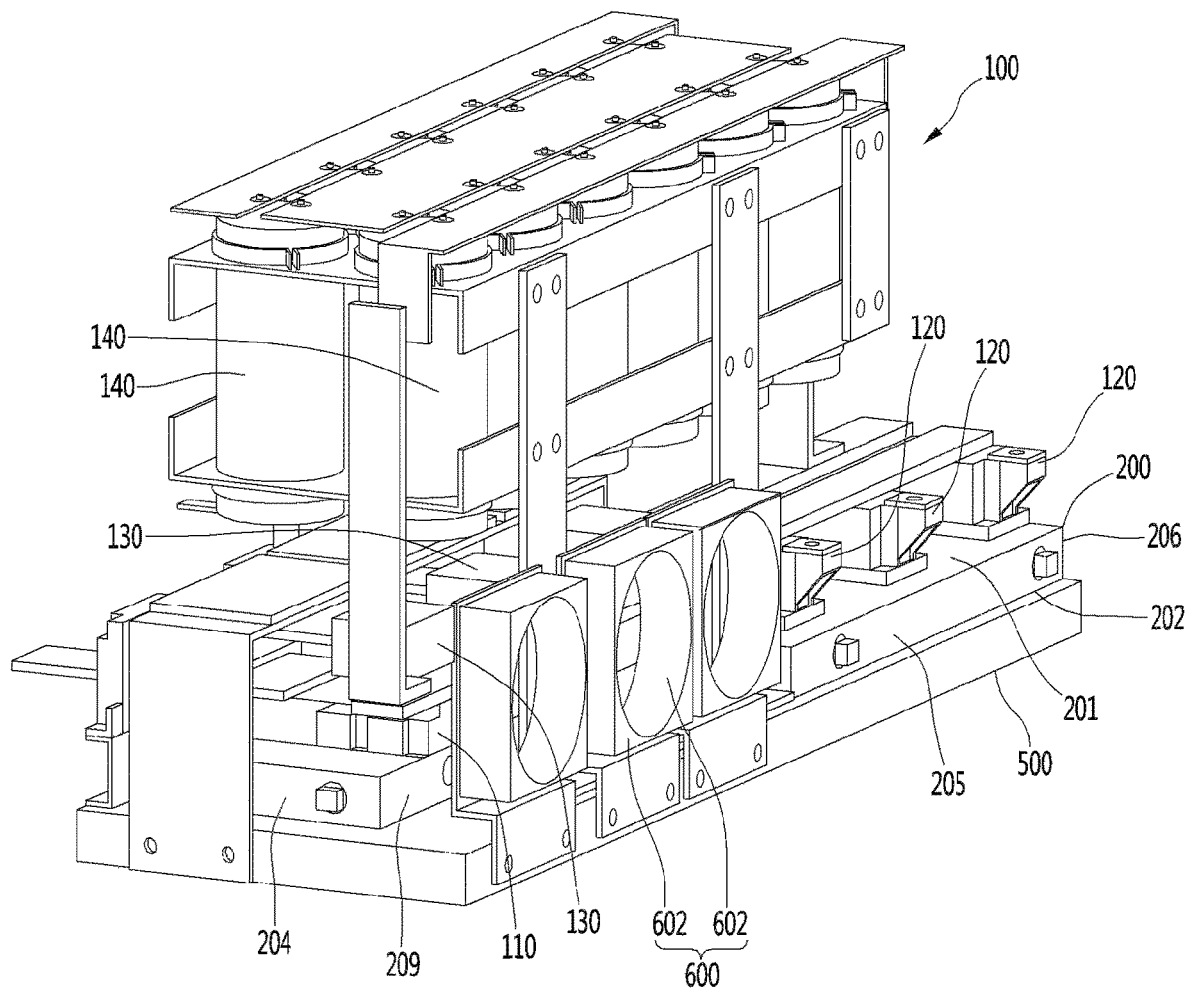

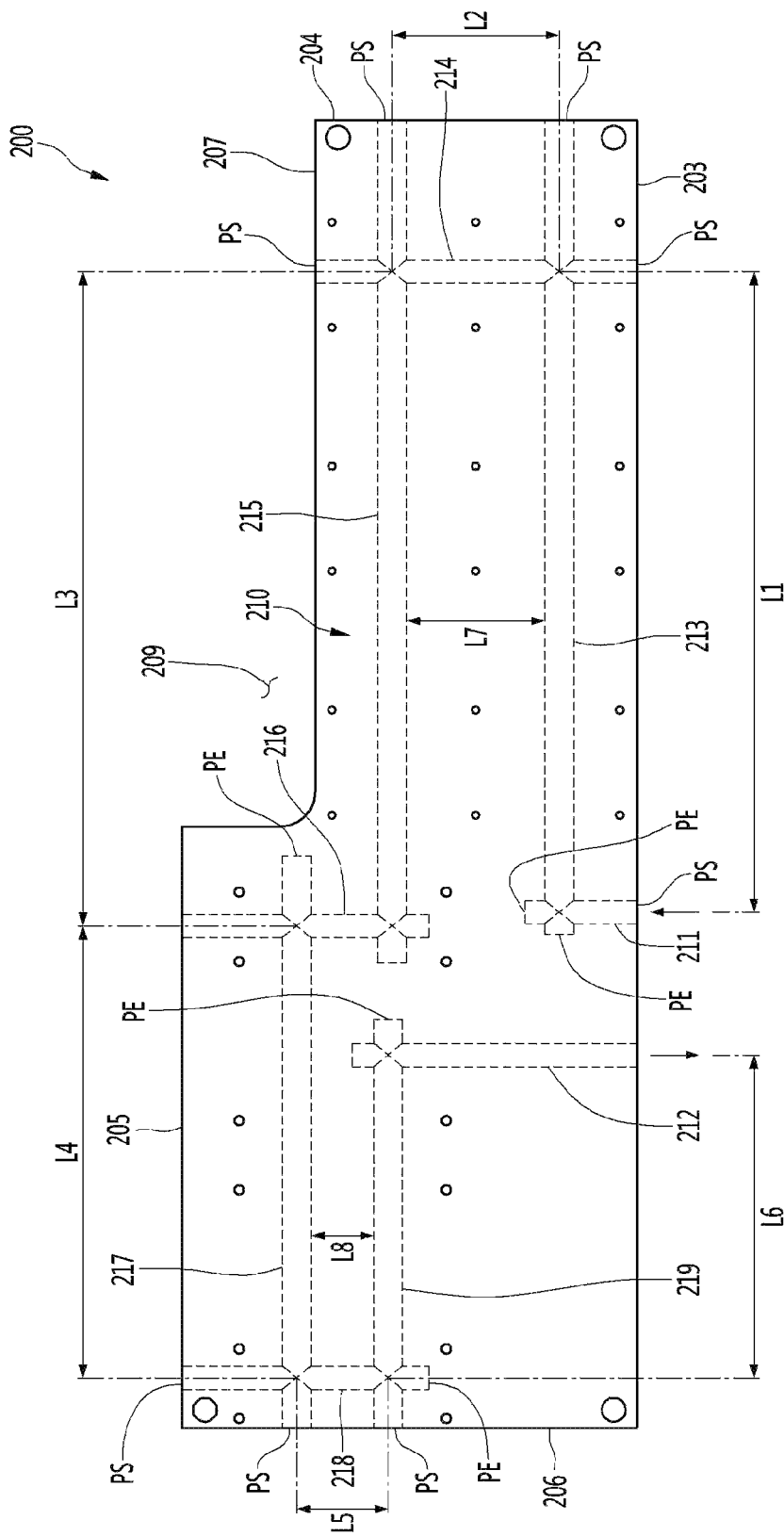

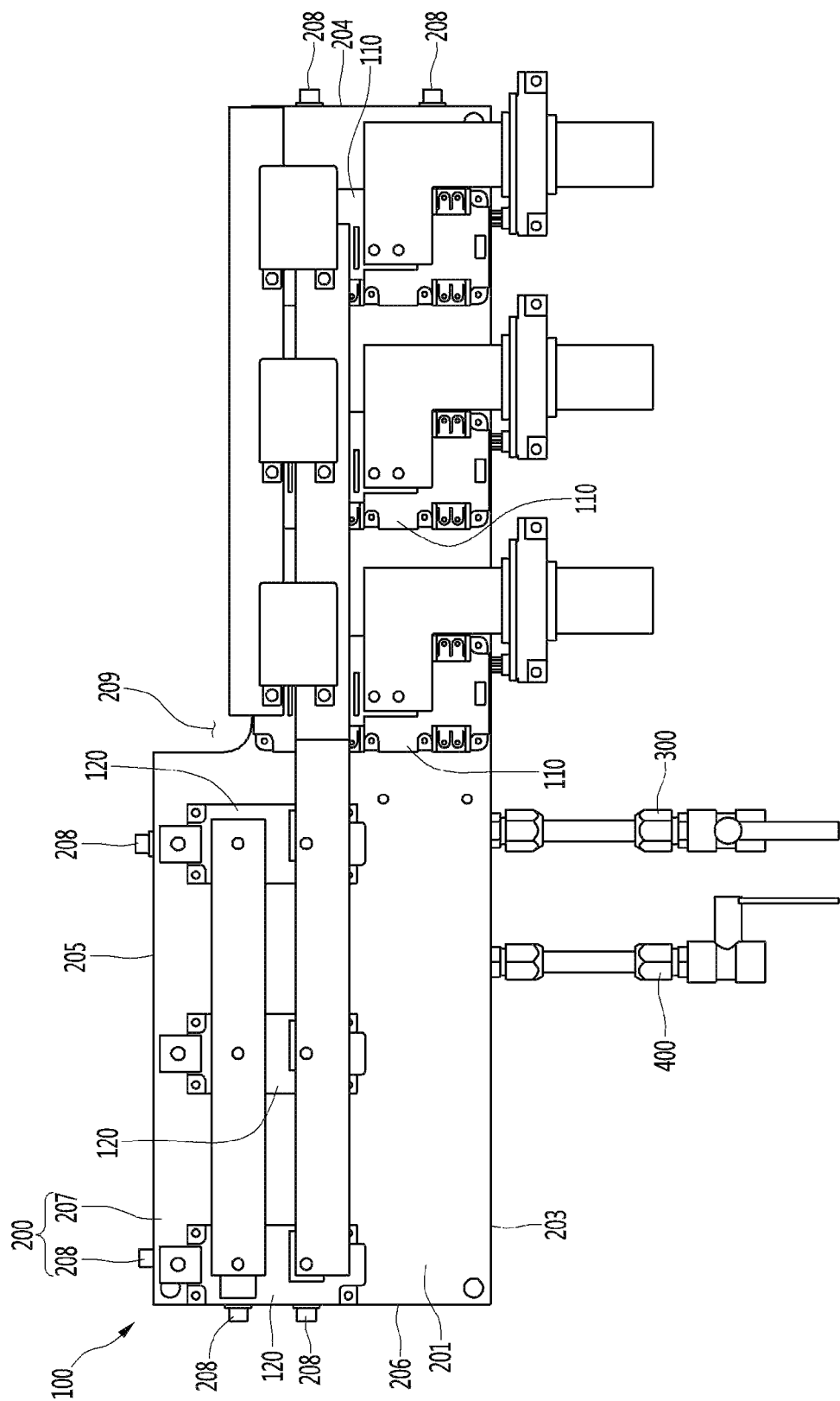

REFRIGERATOR

CROSS-REFERENCE TO RELATED PATENT APPLICATIONS

This application is a U.S. National Stage Application under 35 U.S.C. § 371 of PCT Application No. PCT/KR2019/008509, filed Jul. 10, 2019, which claims priority to Korean Patent Application No. 10-2018-0081885, filed Jul. 13, 2018, whose entire disclosures are hereby incorporated by reference.

TECHNICAL FIELD

The present invention relates to a refrigerator.

BACKGROUND ART

A refrigerator is a machine that cools or freezes a liquid by obtaining a low temperature through a refrigerant. The main part of the refrigerator is constituted by four parts such as a compressor, a condenser, an expansion valve, and an evaporator. The refrigerator is classified into a compression type (reciprocating, rotating, and centrifugal refrigerators) and an absorption type.

The compressor constituting the refrigerator may further include a motor and an inverter that changes a speed of the motor, and the inverter may include an IGBT or a capacitor.

As described above, the refrigerator including the motor and the inverter may further include a separate cooler for absorbing heat from the inverter. Such a cooler may include an air cooling type cooler such as a heat dissipation fan that allows air to flow to the inverter and a water cooling type cooler such as a cooling pipe that guides coolant to the inverter.

When the refrigerator includes the water cooling type cooler, the cooling pipe through which the coolant passes may be disposed around the inverter to absorb heat from the inverter.

In the refrigerator including the water cooling type cooler, a portion of the cooling pipe may be disposed above the IGBT. In this case, condensed water that is dropped after being generated on a surface of the cooling pipe may be dropped to the IGBT disposed below the cooling pipe, and the cooling piping may increase in risk of short circuit or fire in the IGBT.

DISCLOSURE OF THE INVENTION

Technical Problem

An object of the present invention is to provide a refrigerator that is capable of minimizing possibility of short circuit or fire by minimizing dropping of condensed water to an IGBT or a diode.

Another object of the present invention is to provide a refrigerator that is capable of dissipating heat of both an IGBT and a diode and preferentially and reliably dissipating heat of the IGBT having a high heat generation amount.

Technical Solution

A refrigerator according to an embodiment of the present invention includes: a compressor configured to compress a refrigerant; and an inverter module configured to control the compressor, wherein the inverter module includes: a heatsink provided with a cooling passage through which coolant passes; a coolant inlet connected to the heatsink to communicate with an inlet of the cooling passage; a coolant outlet connected to the heatsink to communicate with an outlet of the cooling passage; at least one insulated gate bipolar transistor (IGBT) disposed on a top surface of the heatsink; and at least one diode disposed to be spaced apart from the IGBT on the top surface of the heatsink, wherein the cooling passage includes: an IGBT cooling passage that is closer to the coolant inlet among the coolant inlet and the coolant outlet; and a diode cooling passage that is closer to the coolant outlet among the coolant inlet and the coolant outlet, wherein the diode cooling passage is disposed behind the IGBT cooling passage in a flow direction of the coolant.

The cooling passage may further include a connection passage configured to connect the IGBT cooling passage to the diode cooling passage.

A total length of the IGBT cooling passage may be greater than a total length of the diode cooling passage.

Each of the IGBT cooling passage and the diode cooling passage may include a pair of linear passages parallel to each other and a return passage configured to connect the pair of linear passages to each other. A distance between the pair of linear passages of the IGBT cooling passage may be greater than a distance between the pair of linear passages of the diode cooling passage.

A height of each of the coolant inlet and the coolant outlet may be lower than a height of each of the at least one IGBT and the at least one diode.

The coolant inlet and the coolant outlet may be connected to a circumferential surface of the heatsink.

Each of the IGBT and the diode may be provided in plurality.

The top surface of the heatsink may include: a first area on which the plurality of IGBTs are disposed; a second area on which the plurality of diodes are disposed; and a third area which is disposed between the first area and the second area and on which the IGBT or the diode is not disposed.

The first area may be greater than the second area.

The heatsink may include a single cooling plate having top and bottom surfaces, which are connected to each other by a circumferential surface of the cooling plate and are disposed with the cooling passage therebetween. The cooling passage may be defined by a plurality of linear openings that sequentially communicate in the flow direction of the coolant.

Each of some of the linear openings may have one end disposed in an outer circumferential surface of the cooling plate and the other end disposed inside the cooling plate. Each of others of the linear openings may have a pair of ends intersected with the pair of linear openings and disposed in the outer circumferential surface of the cooling plate.

The coolant inlet may be connected to one end of the linear openings. The coolant outlet may be connected to the other end of the linear openings.

The heatsink may further include a plurality of stoppers configured to block ends of other linear openings to which the coolant inlet and the coolant outlet are not connected.

The refrigerator may further include: a base on the heatsink is mounted; and a heat dissipation fan seated on the base to face the IGBT. An avoidance groove configured to avoid the heat dissipation fan may be defined in a portion of an outer circumference of the heatsink.

A portion of the heat dissipation fan may be disposed in the avoidance groove. The heat dissipation fan may be disposed to face each of the avoidance groove and the IGBT.

The heat dissipation fan may include a fan housing having a hollow portion. The hollow portion may be disposed to face the IGBT.

A lower portion of the fan housing may be disposed to face the avoidance groove in a horizontal direction.

Advantageous Effects

According to the embodiment of the present invention, since the coolant may first cool the IGBT, which is the high heat generating component, and then additionally cool the diode, not only the IGBT may be quickly cooled, but also the diode may be efficiently cooled together with the IGBT.

In addition, since the total length of the IGBT cooling passage is longer than the total length of the diode cooling passage to allow the coolant to sufficiently cool the IGBT first and then cool the diode, the heat dissipation performance of the IGBT may be improved, and the heat of the IGBT may be dissipated reliably.

In addition, the IGBT cooling passage may dissipate the heat of the IGBT at least twice, and the diode cooling passage may dissipate the heat of the diode at least twice, and thus, the coolant passing through the cooling passage may reliably absorb the heat from each of the IGBT and the diode.

In addition, since the distance between the pair of linear passages of the IGBT cooling passage is longer than the distance between the pair of linear passages of the diode cooling passage, the heat of each of the IGBT and the diode, which have different sizes, may be reliably dissipated.

In addition, since the cooling passage is provided between the top and bottom surfaces of the single cooling plate, the heatsink may be less likely to leak the coolant compared to the case in which the cooling passage is provided between the upper plate and the lower plate, and the reliability of the heatsink may be high.

In addition, since the heat dissipation fan is disposed in the avoidance groove, the heat dissipation fan may be disposed close to the IGBT, and the inverter module may be as compact as possible.

In addition, since the IGBT and the diode are disposed on the top surface of the heatsink, and the coolant inlet and the coolant outlet are connected to one surface of the plurality of circumferential surfaces of the heatsink, the condensed water dropped onto the surface the coolant inlet or the coolant outlet may not be permeated into the IGBT and the diode, and thus, the possibility of the short circuit due to the condensed water dropped onto the surface of the coolant inlet or the coolant outlet may be removed.

BRIEF DESCRIPTION OF THE DRAWINGS

FIG. 1 is a view of a refrigerator to which a compressor is applied according to an embodiment of the present invention, FIG. 2 is a perspective view of the refrigerator to which the compressor is applied according to an embodiment of the present invention, FIG. 3 is a view illustrating the inside of an inverter enclosure according to an embodiment of the present invention, FIG. 4 is a perspective view of an inverter module according to an embodiment of the present invention, FIG. 5 is a plan view of a heatsink illustrated in FIG. 4, and FIG. 6 is a plan view when an IGBT and a diode are seated on the heatsink illustrated in FIG. 5.

MODE FOR CARRYING OUT THE INVENTION

Hereinafter, detailed embodiments will be described in detail with reference to the accompanying drawings.

FIG. 1 is a view of a refrigerator to which a compressor is applied according to an embodiment of the present invention, FIG. 2 is a perspective view of the refrigerator to which the compressor is applied according to an embodiment of the present invention, FIG. 3 is a view illustrating the inside of an inverter enclosure according to an embodiment of the present invention, FIG. 4 is a perspective view of an inverter module according to an embodiment of the present invention, FIG. 5 is a plan view of a heatsink illustrated in FIG. 4, and FIG. 6 is a plan view when an IGBT and a diode are seated on the heatsink illustrated in FIG. 5.

A refrigerator according to this embodiment may include a compressor 1, a condenser 2, an expansion mechanism 3, and an evaporator 4, and the compressor 1 may compress a refrigerant evaporated in the evaporator 4. The refrigerant compressed in the compressor 1 and then discharged from the compressor 1 may be suctioned into the compressor 1 after passing through the condenser 2, the expansion mechanism 3, and the evaporator 4 in sequence.

The compressor 1 may be connected to the evaporator 4 through a suction body 5 and may be connected to the condenser 2 through a discharge body 6.

The compressor 1 may compress a gas refrigerant introduced from the evaporator 4. The compressor 1 may be configured to have variable operation capacity and may be configured to compress the refrigerant in multiple stages.

The compressor 1 may include a motor 10 that generates driving force for compressing the refrigerant. The motor 10 may be an AC motor or a three-phase induction motor. The motor 10 may include a motor housing 12 having a space defined therein. Also, the motor 10 may further include a shaft, a rotor mounted on an outer circumference of the shaft, and a stator installed inside the housing 12 to surround the outer circumference of the rotor. The rotor may include a magnet, and the stator may include a stator core and a coil wound around the stator core.

The compressor 1 may be a centrifugal compressor that suctions a refrigerant gas in an axial direction and discharges the refrigerant gas in a centrifugal direction, and the compressor 1 may further include a volute case 20. The compressor 1 may include a centrifugal impeller connected to the shaft of the motor 10. The centrifugal impeller may be rotatably accommodated in an impeller accommodation space defined inside the volute case 20, and the gas refrigerant may flow toward a volute.

In addition, the compressor 1 may further include an inlet guide 21. The inlet guide 21 may be connected to the volute case 20 to guide the gas refrigerant to the volute case 20. The suction body 5 may be connected to the inlet guide 21, and the refrigerant flowing from the suction body 5 may be guided into the volute case 20 through the inlet guide 21.

Each of the condenser 2 and the evaporator 4 may be a shell and tube heat exchanger, and in this case, each of the condenser 2 and the evaporator 4 may include a substantially hollow cylindrical shell and an inner tube which is disposed in the shell and through which a coolant or cold water passes.

The coolant may be introduced into and discharged from the condenser 2, and heat exchange between the refrigerant and the coolant may be performed in the condenser 2. Also, the coolant may be heated in a process of passing through the condenser 2.

The expansion mechanism 3 may be an electronic expansion valve disposed between the condenser 2 and the evaporator 4.

The cold water may be introduced into and discharged from the evaporator 4, and heat exchange between the refrigerant and cold water may be performed in the evaporator 4. The cold water may be cooled in a process of passing through the evaporator 4, and the cooled cold water may be supplied to a cold water consumer.

The compressor 1 may be installed to be disposed above at least one of the condenser 2 and the evaporator 4 and may be modularized with the condenser 2 and the evaporator 4 into one module.

The refrigerator may include the compressor 1, in particular, an inverter 7 (see FIG. 2) that changes a rotation speed of the motor 10 by changing a frequency of the motor 10.

The inverter 7 may include an inverter enclosure 90 (see FIG. 2). A space in which various control components capable of controlling the compressor 1, in particular, the motor 10 is accommodated may be defined inside the inverter enclosure 90. The inverter 7 may further include a door 91 (see FIG. 2) connected to the inverter enclosure 90 to open and close the space of the inverter enclosure 90.

An exhaust body 92 (see FIG. 3) through which air flowing by a heat dissipation fan 600 to be described later is discharged to the outside of the inverter enclosure 90 may be disposed in the inverter enclosure 90. An example of the exhaust body 92 may be an exhaust grill provided in a grill shape.

The inverter 7 may include an inverter module 100 that controls the compressor 1, and the inverter module 100 may be accommodated in the inverter enclosure 90, as illustrated in FIG. 3.

The inverter module 100 may include a power semiconductor module or the like.

As illustrated in FIGS. 3 and 4, the inverter module 100 may be an assembly in which an insulated gate bipolar transistor (IGBT) 110, a diode 120, a snubber CAP 130, a capacitor 140, and a heatsink 200 are modularized.

In the inverter module 100 configured as described above, at least one IGBT 110, at least one diode 120, at least one snubber CAP 130, at least one capacitor 140, and the heatsink 200 may be assembled into one module at the outside of the inverter enclosure 90. The assembled assembly may be inserted into the space of the inverter enclosure 90. In this case, workability and productivity of the inverter assembly may be improved.

When the motor 10 is a three-phase AC motor, the inverter module 100 may include three IGBTs 110, three diodes 120, and three snubber CAPs 130.

In addition, the IGBT 110 may be a semiconductor device capable of high-power low-speed switching, and an amount of heat generated during an operation may be greater than that of heat generated in the diode 120 or the snubber CAP 130.

The inverter module 100 may be configured so that one heatsink 200 radiates the IGBT 110 and the diode 120 together. For this, each of the IGBT 110 and the diode 120 may be disposed in contact with the heatsink 200.

When the inverter module 100 includes three IGBTs 110 and three diodes 120, the three IGBTs 110 and the three diodes 120 may be spaced apart from each other, and one heatsink 200 may absorb heat from each of the three IGBTs 110 and the three diodes 120 to transfer the heat to a working fluid passing through the heatsink 200.

At least one IGBT 110 may be disposed on a top surface 201 of the heatsink 200 as illustrated in FIG. 6. The IGBT 110 may be in contact with the top surface 201 of the heatsink 200, and the heat of the IGBT 110 may be transferred to the heatsink 200 through the top surface 201 of the heatsink 200 and then be transferred to the coolant passing through a cooling passage 210 of the heatsink 200.

At least one diode 120 may be disposed on the top surface 201 of the heatsink 200 so as to be spaced apart from the IGBT 110 as illustrated in FIG. 6. The diode 120 may be in contact with the top surface 201 of the heatsink 200, and the heat of the diode 120 may be transferred to the heatsink 200 through the top surface 201 of the heatsink 200 and then be transferred to the coolant passing through the cooling passage 210.

The heatsink 200 may be a heat dissipation plate that absorbs the heat from the IGBT 110 and the diode 120 and may have a three-dimensional shape having a thickness in a vertical direction. The heatsink 200 may include the top surface 201, a bottom surface 202, and a plurality of circumferential surfaces 203, 204, 205, and 206.

The cooling passage 210 through which the coolant passes may be provided in the heatsink 200. The cooling passage 210 may include an inlet 211 through which the coolant is introduced and an outlet 212 through which the coolant is discharged.

The coolant may be a coolant such as water, but the coolant according to this embodiment is not limited to the water.

The coolant inlet 300 and the coolant outlet 400 may be connected to the heatsink 200 as illustrated in FIGS. 3 and 6.

The coolant inlet 300 and the coolant outlet 400 may be connected to a cooling system such as a coolant pump and a radiator (or a coolant cooling tower), and the coolant cooled by the cooling system may be introduced into the heatsink 200, in particular, the cooling passage through the coolant inlet 300.

The coolant inlet 300 may be connected to the heatsink 200 to communicate with an inlet 211 of the cooling passage 210 and may guide the coolant to the cooling passage 210.

The coolant outlet 400 may be connected to the heatsink 200 to communicate with an outlet 212 of the cooling passage 210, and the coolant discharged from the cooling passage 210 may be guided to the coolant outlet 400.

The cooling passage 210 may include IGBT cooling passages 213, 214, and 215, a connection passage 216, and diode cooling passages 217, 218, and 219.

The IGBT cooling passages 213, 214, and 215 and the diode cooling passages 217, 218, and 219 may have names classified according to an object to be cooled.

The IGBT cooling passages 213, 214, and 215 may be closer to the coolant inlet 300 of the coolant inlet 300 and the coolant outlet 400. The IGBT cooling passages 213, 214, and 215 may be disposed behind the inlet 211 in a flow direction of the coolant and may communicate with the inlet 211.

The connection passage 216 may be provided to connect the IGBT cooling passages 213, 214, and 215 to the diode cooling passages 217, 218, and 219. The coolant may first cool the IGBT 110 while passing through the IGBT cooling passages 213, 214, and 215, and then flow into the diode cooling passages 217, 218, and 219 through the connection passage 216 to cool the diode 120 while passing through the diode cooling passages 217, 218, and 219.

The diode cooling passages 217, 218, and 219 may be closer to the coolant outlet 400 of the coolant inlet 300 and the coolant outlet 400.

The diode cooling passages 217, 218, and 219 may be disposed behind the IGBT cooling passages 213, 214, and 215 in the flow direction of the coolant. The diode cooling passages 217, 218, and 219 may communicate with the outlet 212 and may be disposed between the connection passage 216 and the outlet 212 in the flow direction of the coolant.

It is preferable that the heatsink 200 as described above dissipates the heat of the IGBT 110 having a heat generation amount greater than that of the diode 120 to perform the heat dissipation with high reliability. For this, a total length (L1+L2+L3) may be greater than a total length L4, L5, and L6 of the diode cooling passages 217, 218, and 219.

Each of the IGBT cooling passages 213, 214, and 215 and the diode cooling passages 217, 218, and 219 may include a pair of linear passages and a return passage.

The return passage may guide the coolant flowing in one of the pair of linear passages to the other. The return passage may be disposed perpendicular to each of the pair of linear passages.

The top surface 201 of the heatsink 200 may include a first area on which the plurality of IGBTs 110 are disposed, a second area on which the plurality of diodes 120 are disposed, and a third area which is disposed between the first area and the second area and on which the IGBT 110 or the diode 120 is not disposed. Each of the first area and the second area may have a rectangular shape, and the first area may be greater than the second area.

The IGBT cooling passages 213, 214, and 215 may include a pair of linear passages 213 and 215 parallel to each other and a return passage 214 connecting the pair of linear passages 213 and 215 to each other. The IGBT cooling passages 213, 214, and 215 may be passages disposed below the plurality of IGBTs 110 among the cooling passages 210 and may be passages including the pair of linear passages 213 and 215 and the return passage 214.

The diode cooling passages 217, 218, and 219 may include a pair of linear passages 217 and 219 parallel to each other and a return passage 218 connecting the pair of linear passages 217 and 219 to each other. The diode cooling passages 217, 218, and 219 may be passages disposed below the plurality of diodes 120 among the cooling passages 210 and may be passages including the pair of linear passages 217 and 219 and the return passage 218.

A distance L7 (hereinafter, referred to as a first distance) between the pair of linear passages constituting the IGBT cooling passages 213, 214, and 215 may be greater than a distance L8 (hereinafter, referred to as a second distance) between the pair of linear passages 217 and 219 constituting the diode cooling passages 217, 218, and 219.

The IGBT 110 and the diode 120 may have sizes different from each other, and the IGBT 110 may have a size greater than that of the diode 120. As described above, when the first distance L7 is greater than the second distance L8, the heatsink 200 may reliably dissipate heat of each of the IGBTs 110 and the diodes 120, which have different sizes.

The coolant inlet 300 and the coolant outlet 400 may be connected to the circumferential surfaces 203, 204, 205, and 206 of the heatsink 200. The coolant inlet 300 and the coolant outlet 400 may be connected to one of the plurality of circumferential surfaces 203, 204, 205, and 206 of the heatsink 200, that is, the same surface 203.

Each of the plurality of circumferential surfaces 203, 204, 205, and 206 of the heatsink 200 may be less than each of that of the IGBT 110 and the diode 120, and the coolant inlet 300 and the coolant outlet 400 may be bonded to the same surface 203 that is one surface of the plurality of circumferential surfaces 203, 204, 205, and 206 through welding.

In this embodiment, even if a coolant leakage occurs in the coolant inlet 300 or the coolant outlet 400, since each of the coolant inlet 300 and the coolant outlet 400 has a height greater than that of each of the IGBT 110 and the diode, the leaking coolant may not be dropped or introduced into the IGBT 110 or the diode 120.

Also, condensed water may be generated and dropped on a surface of the coolant inlet 300 or the coolant outlet 400. Here, since each of the coolant inlet 300 and the coolant outlet 400 has a height lower than that of each of the IGBT 110 and the diode 120, the condensed water dropped on the surface of the coolant inlet 300 or the coolant outlet 400 may not fall to the IGBT 110 and the diode 120.

The heatsink 200 may include a single cooling plate 207 in which the cooling passage 210 is provided.

An outer surface of the cooling plate 207 may have a top surface 201 and a bottom surface 202, which are connected to each other by the circumferential surfaces 203, 204, 205, and 206. The cooling passage 210 may be disposed between the top surface 201 and the bottom surface 202 of the cooling plate 207.

The cooling passage 210 may be spaced apart from each of the top surface 201 and the bottom surface 202 of the cooling plate 207 in the vertical direction, and the heat transferred through the top surface 201 of the cooling plate 207 may be transferred to the cooling plate 210 and the coolant through a portion disposed between the top surface of the cooling plate 207 and the cooling passage 210.

A plurality of linear openings defining the cooling passage 210 may be defined in the cooling plate 207.

An example of the cooling plate 207 may include a groove having an opened end PS in which all the plurality of linear openings are defined in an outer circumferential surface of the cooling plate 207, and the block other end disposed inside the cooling plate 207.

Another example of the cooling plate 207 may include a groove having one end PS in which a portion of the plurality of linear openings is disposed in the outer circumferential surface of the cooling plate 207 and the block other end PE disposed inside the cooling plate 207. Alternatively, the cooling plate 208 may include a hole including a pair of one end PS in which the rest crosses a pair of linear openings adjacent to each other and is disposed in the outer circumferential surface of the cooling plate 207.

The coolant inlet 300 may be connected to one end PS of one of the linear openings, and the linear opening, to which the coolant inlet 300 is connected, among the linear openings may serve as the inlet 211 of the cooling passage 210. Among the linear openings, a linear opening to which the coolant outlet 400 is connected may serve as the outlet 212 of the cooling passage 210.

The heatsink 200 may further include a plurality of stoppers 208 that block the open end PS of each of other linear openings, to which the coolant inlet 300 and the coolant outlet 400 are not connected, among the linear openings.

The heatsink 200 may have a double plate structure in which an upper cooling plate and a lower cooling plate are bonded to each other. However, the heatsink having the double plate structure may have high possibility of leakage of the coolant through a gap between the upper cooling plate and the lower cooling plate, and also, a process of bonding the upper cooling plate to the lower cooling plate at high precision may be required.

On the other hand, as described above, when the heatsink 200 and the cooling passage 210 are configured by a single cooling plate 207 and a plurality of stoppers 208, the possibility of leakage of the coolant while the coolant passing through the cooling passage 210 passes through the heatsink 200 may be minimized to improve reliability of the heatsink 200.

An assembly of the heatsink 200, the coolant inlet 300, and the coolant outlet 400 configured as described above may have two bonding portions, and thus, the welded portion may be minimized, and also a plurality of cooling pipes may be sequentially connected to each other, and the possible of leakage of the coolant may be minimized compared to a case in which a portion of the plurality of cooling pipes is bent.

The refrigerator, in particular, the inverter 7 may further include a base 500 and at least one heat dissipation fan 600 seated on the base 500 as illustrated in FIG. 4. At least one heat dissipation fan 600 may be mounted on the base 500 toward the IGBT 100.

The heatsink 200 may be mounted on the base 500 and be supported on the base 500. An avoidance groove 209 that avoids the heat dissipation fan 600 may be defined in a portion of the outer circumference of the heatsink 200.

A portion of the heat dissipation fan 600 may be disposed to be accommodated in the avoidance groove 209. The heat dissipation fan 600 may face each of the avoidance groove 209 and the IGBT 100. A portion of a lower portion of the heat dissipation fan 600 may face the heatsink 200, in particular, the avoidance groove 209 in a horizontal direction.

The heat dissipation fan 600 may be a box fan having a hexahedral shape as a whole, and the heat dissipation fan 600 may include a fan housing 604 in which a hollow portion 602 is defined. The heat dissipation fan 600 may include a fan (not shown) rotatably disposed in the hollow portion 602 and a motor (not shown) mounted in the fan housing 604 and connected to a fan.

A portion of a lower portion of the fan housing 604 may face the avoidance groove 209 of the heat dissipation fan 600 in the horizontal direction, and all or most of the hollow portion 602 may face the IGBT 110.

As described above, when a portion of the heat dissipation fan 600 is disposed in the avoidance groove 209, the avoidance groove 209 may not be defined in the heatsink 200, and the entire inverter module 100 may be compact compared to a case in which the heat dissipation fan 600 is disposed in the heatsink 200.

The condensed water may be generated on the surface of the heatsink 200. Here, since the height of each of the IGBT 110 and the diode 120 is greater than that of the heatsink 200, possibility of an occurrence of short circuit and electric shock, which may occur when the condensed water generated on the surface of the heatsink 200 is dropped on the IGBT 110 and the diode 120, may be minimized.

The above-disclosed subject matter is to be considered illustrative, and not restrictive, and the appended claims are intended to cover all such modifications, enhancements, and other embodiments, which fall within the true spirit and scope of the present disclosure.

Thus, the embodiment of the present disclosure is to be considered illustrative, and not restrictive, and the technical spirit of the present disclosure is not limited to the foregoing embodiment.

Therefore, the scope of the present disclosure is defined not by the detailed description of the invention but by the appended claims, and all differences within the scope will be construed as being included in the present disclosure.

The invention claimed is:

1. A refrigerator, comprising:
a compressor configured to compress a refrigerant; and
an inverter module configured to control the compressor,
wherein the inverter module includes:
  a heatsink provided with a cooling passage through which coolant passes;
  a coolant inlet connected to the heatsink to communicate with an inlet of the cooling passage;
  a coolant outlet connected to the heatsink to communicate with an outlet of the cooling passage;
  at least one insulated gate bipolar transistor (IGBT) disposed on a top surface of the heatsink; and
  at least one diode disposed to be spaced apart from the IGBT on the top surface of the heatsink,
wherein the cooling passage comprises:
  an IGBT cooling passage that is closer to the coolant inlet among the coolant inlet and the coolant outlet; and
  a diode cooling passage that is closer to the coolant outlet among the coolant inlet and the coolant outlet,
wherein the diode cooling passage is disposed behind the IGBT cooling passage in a flow direction of the coolant,
wherein the heatsink comprises a single cooling plate having top and bottom surfaces, which are connected to each other by a circumferential surface of the cooling plate and are disposed with the cooling passage therebetween,
wherein the cooling passage is defined by a plurality of linear openings that sequentially communicate in the flow direction of the coolant, and
wherein some of the linear openings have one end, different than the coolant inlet and the coolant outlet, disposed in an outer circumferential surface of the cooling plate and another end disposed inside the cooling plate, and the remaining linear openings have a pair of ends intersected with a pair of the some of the linear openings having the one end disposed in the outer circumferential surface of the cooling plate.

2. The refrigerator according to claim 1, wherein
the coolant inlet is connected to one end of the linear openings,
the coolant outlet is connected to another end of the linear openings, and
the heatsink further comprises a plurality of stoppers configured to block ends of other linear openings to which the coolant inlet and the coolant outlet are not connected.

3. A refrigerator, comprising:
a compressor configured to compress a refrigerant; and
an inverter module configured to control the compressor,
wherein the inverter module includes:
  a heatsink provided with a cooling passage through which coolant passes;
  a coolant inlet connected to the heatsink to communicate with an inlet of the cooling passage;
  a coolant outlet connected to the heatsink to communicate with an outlet of the cooling passage;
  at least one insulated gate bipolar transistor (IGBT) disposed on a top surface of the heatsink; and
  at least one diode disposed to be spaced apart from the IGBT on the top surface of the heatsink, wherein the cooling passage comprises:
an IGBT cooling passage that is closer to the coolant inlet among the coolant inlet and the coolant outlet; and
a diode cooling passage that is closer to the coolant outlet among the coolant inlet and the coolant outlet,
wherein the diode cooling passage is disposed behind the IGBT cooling passage in a flow direction of the coolant,
wherein the refrigerator further comprises:
a base on which the heatsink is mounted; and
a heat dissipation fan seated on the base to face the IGBT, and
wherein an avoidance groove configured to avoid the heat dissipation fan is defined in a portion of an outer circumference of the heatsink.

4. The refrigerator according to claim 3, wherein
a portion of the heat dissipation fan is disposed in the avoidance groove, and
the heat dissipation fan is disposed to face each of the avoidance groove and the IGBT.

5. The refrigerator according to claim 4, wherein
the heat dissipation fan comprises a fan housing having a hollow portion, and
the hollow portion is disposed to face the IGBT.

6. The refrigerator according to claim 5, wherein a lower portion of the fan housing is disposed to face the avoidance groove in a horizontal direction.

* * * * *